United States Patent
Yamauchi

(10) Patent No.: US 6,333,874 B2
(45) Date of Patent: Dec. 25, 2001

(54) SEMICONDUCTOR MEMORY DEVICE HAVING NORMAL AND STANDBY MODES, SEMICONDUCTOR INTEGRATED CIRCUIT AND MOBILE ELECTRONIC UNIT

(75) Inventor: Hiroyuki Yamauchi, Takatsuki (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 09/814,855

(22) Filed: Mar. 23, 2001

(30) Foreign Application Priority Data

Mar. 30, 2000 (JP) .................................. 12-094757

(51) Int. Cl.[7] .................................................. G11C 16/04
(52) U.S. Cl. ...................... 365/189.09; 365/154; 365/203
(58) Field of Search ........................ 365/189.09, 154, 365/203, 189.06, 226

(56) References Cited

U.S. PATENT DOCUMENTS 6,038,191 * 3/2000 Fukuhara et al. .................. 365/229
6,111,779 * 8/2000 You ................................... 365/154
6,205,049 * 3/2001 Lien et al. ......................... 365/154

FOREIGN PATENT DOCUMENTS

| 2000-03593 | 1/2000 | (JP) . |
| 2000-48572 | 2/2000 | (JP) . |

* cited by examiner

*Primary Examiner*—Son T. Dinh
(74) *Attorney, Agent, or Firm*—McDermott, Will & Emery

(57) ABSTRACT

In a standby mode, a word driver supplies a negative voltage onto its associated word line, and a precharge circuit electrically disconnects its associated pair of bit lines from power supply nodes receiving a supply voltage. In this manner, access transistors, connected to L- or H-level data retention nodes, can have their source-drain voltage lowered to such a level as eliminating a GIDL current. As a result, the amount of current dissipated in the standby mode can be reduced without causing the GIDL current problem.

13 Claims, 16 Drawing Sheets

SEMICONDUCTOR MEMORY DEVICE HAVING NORMAL AND STANDBY MODES, SEMICONDUCTOR INTEGRATED CIRCUIT AND MOBILE ELECTRONIC UNIT

BACKGROUND OF THE INVENTION

The present invention relates to a semiconductor memory device having normal and standby modes and also relates to a semiconductor integrated circuit and a mobile electronic unit including a device of that type.

A semiconductor memory device called a static random access memory (SRAM) is basically made up of flip-flops, and is easy to use because such a device needs no refreshing. An SRAM can also operate at a high speed and allows a large operation margin. By taking advantage of all these beneficial features, SRAMs are often used as memories for mobile electronic units, for example. In addition, as transistors have their sizes further reduced over the last couple of years, mobile electronic units have also been downsized.

However, the smaller a transistor, the lower its breakdown voltage. Accordingly, a transistor of a very small size should be operated with its operating voltage lowered. Furthermore, to enable a transistor to operate at a low voltage without sacrificing its operating speed, the threshold voltage of the transistor needs to be reduced. For that reason, small-sized mobile electronic units, including cell phones, which are normally driven by battery, use transistors with a low threshold voltage. However, if the threshold voltage of a transistor is too low, then the transistor with that low threshold voltage cannot be cut off completely, thus allowing some leakage current to flow. In that case, an increased amount of current is dissipated in vain in a standby mode.

A battery-driven mobile electronic unit of a small size is required to operate at a low voltage and with low power dissipation. As for a cell phone, in particular, it is one of the key features determining its market value how long the cell phone can hold its standby state. And to make the stand-by state as long as possible, the amount of current dissipated in the standby mode should be minimized.

SUMMARY OF THE INVENTION

It is therefore an object of the present invention to provide a semiconductor memory device that dissipates a reduced amount of current in its standby mode.

A semiconductor memory device according to an aspect of the present invention has normal and standby modes and includes: array of memory cells; a plurality of word lines; a plurality of bit lines; a plurality of access transistors; and potential difference generating means. In the memory array, multiple memory cells are arranged in columns and rows. Each of the word lines is associated with one of the rows. Each of the bit lines is associated with one of the columns. Each of the access transistors is provided for an associated one of the memory cells, connected between a data retention node of the associated memory cell and one of the bit lines that is associated with the memory cell, and receives, at its gate, a voltage on one of the word lines that is associated with the memory cell. And the potential difference generating means generates a negative potential difference between the gate and source of one of the access transistors while the device is in the standby mode. The access transistor is connected to a data retention node storing logical-one-level or logical-zero-level data thereon.

In one embodiment of the present invention, if the potential difference between the gate and source of the access transistors is 0 V, a current of 100 pA/$\mu$m or more flows between the drain and source of the access transistors.

While the inventive semiconductor memory device is in the standby mode, a negative potential difference is generated between the gate and source of one of the access transistors that is connected to a data retention node storing logical-one-level or logical-zero-level data thereon. As a result, the amount of leakage current, flowing from the logical-one-level data retention node into one of a pair of bit lines via the access transistor or from the other bit line into the logical-zero-level data retention node via the access transistor, can be reduced.

In another embodiment of the present invention, the potential difference generating means preferably includes potential holding means for holding a potential on the bit lines at a predetermined positive level while the device is in the standby mode.

In the semiconductor memory device of this embodiment, the potential level on the bit lines is higher than that on the word lines during the standby mode. Accordingly, a negative potential difference is generated between the gate and source of one of the access transistors that is connected to the logical-one-level data retention node. As a result, the amount of leakage current, flowing from the logical-one-level data retention node into the bit line via the access transistor, can be reduced. In addition, by holding the potential on the bit lines at such a level as not causing the problem of gate-induced-drain-leakage (GIDL) current, the GIDL current problem is avoidable.

In still another embodiment, the potential difference generating means preferably includes means for allowing the bit lines to be floating while the device is in the standby mode.

In the semiconductor memory device of this embodiment, the leakage current, flowing from the logical-one-level data retention node into the bit line via the access transistors, precharges the bit lines during the standby mode. As a result, the potential on the bit lines can be held at a positive level.

In yet another embodiment, the potential difference generating means preferably includes word line driving means for supplying a negative voltage onto the word lines while the device is in the standby mode.

In the semiconductor memory device of this embodiment, the potential level on the word lines is lower than the potential level at the logical-zero-level data retention node during the standby mode. Accordingly, a negative potential difference is generated between the gate and source of one of the access transistors that is connected to the logical-zero-level data retention node. As a result, the amount of leakage current, flowing from the bit line into the logical-zero-level data retention node via the access transistor, can be reduced.

A semiconductor memory device according to another aspect of the present invention has normal and standby modes and includes: array of memory cells; a plurality of word lines; a plurality of bit lines; a plurality of access transistors; word line driving means; and precharge means. In the memory array, multiple memory cells are arranged in columns and rows. Each of the word lines is associated with one of the rows. Each of the bit lines is associated with one of the columns. Each of the access transistors is provided for an associated one of the memory cells, connected between a data retention node of the associated memory cell and one of the bit lines that is associated with the memory cell, and receives, at its gate, a voltage on one of the word lines that is associated with the memory cell. The word line driving means activates one of the word lines, which is associated with one of the memory cells that is to be accessed. And the precharge means precharges the bit lines to a supply voltage level during a predetermined period before the memory cell is accessed. While the device is in the standby mode, the word line driving means supplies a negative voltage onto the word lines, and the precharge means electrically disconnects the bit lines from a power supply node receiving a supply voltage.

While the inventive semiconductor memory device is in the standby mode, no power is supplied from the power supply node to the bit lines that are electrically disconnected from the power supply node. Accordingly, the potential level on the bit lines is lower than the supply voltage level, and is normally stabilized at around an intermediate potential level, which is half as high as the supply voltage level. As a result, the source-drain voltage of the access transistors, connected to the data retention nodes, can be lowered to such a level as not causing the GIDL current problem.

Thus, the inventive semiconductor memory device can reduce the amount of current dissipated in the standby mode while eliminating the GIDL current problem, because the device supplies a negative voltage onto the word lines and electrically disconnects the bit lines from the power supply node during the standby mode.

In one embodiment of the present invention, the inventive device preferably further includes means for holding a potential on the bit lines at a predetermined level while the device is in the standby mode.

In this particular embodiment, the predetermined level is preferably equal to or lower than an intermediate potential level.

In the semiconductor memory device of this embodiment, a potential on the bit lines is held at a predetermined level during the standby mode. Accordingly, a precharge period, which is necessary for the device to return from the standby mode into the normal mode, can have a constant length.

In another embodiment of the present invention, the word line driving means preferably includes: means for supplying a ground voltage onto the word lines while the device is in the standby mode; and means for supplying the negative voltage onto the word lines after the ground voltage has been supplied thereto.

In the semiconductor memory device of this embodiment, the ground voltage supplying means once drops the potential on the word lines to the ground level at a high speed. Accordingly, the power dissipated by the negative voltage supplying means can be reduced.

A semiconductor integrated circuit according to still another aspect of the present invention includes a semiconductor memory device according to the second aspect of the present invention.

In one embodiment of the present invention, the semiconductor integrated circuit preferably further includes a logic circuit section and supply switching means. The supply switching means applies the supply voltage to the logic circuit section while the device is in the normal mode but does not apply the supply voltage to the logic circuit section while the device is in the standby mode. The precharge means of the semiconductor memory device precharges the bit lines to the supply voltage level when the device switches its mode of operation from the standby mode into the normal mode.

A mobile electronic unit according to yet another aspect of the present invention includes the inventive semiconductor integrated circuit.

In one embodiment of the present invention, the mobile electronic unit preferably further includes means for supplying a mode switching signal to the semiconductor integrated circuit to instruct the circuit to switch the mode of operation from the normal mode into the standby mode, or vice versa.

DESCRIPTION OF THE PREFERRED EMBODIMENTS

Figure 1:
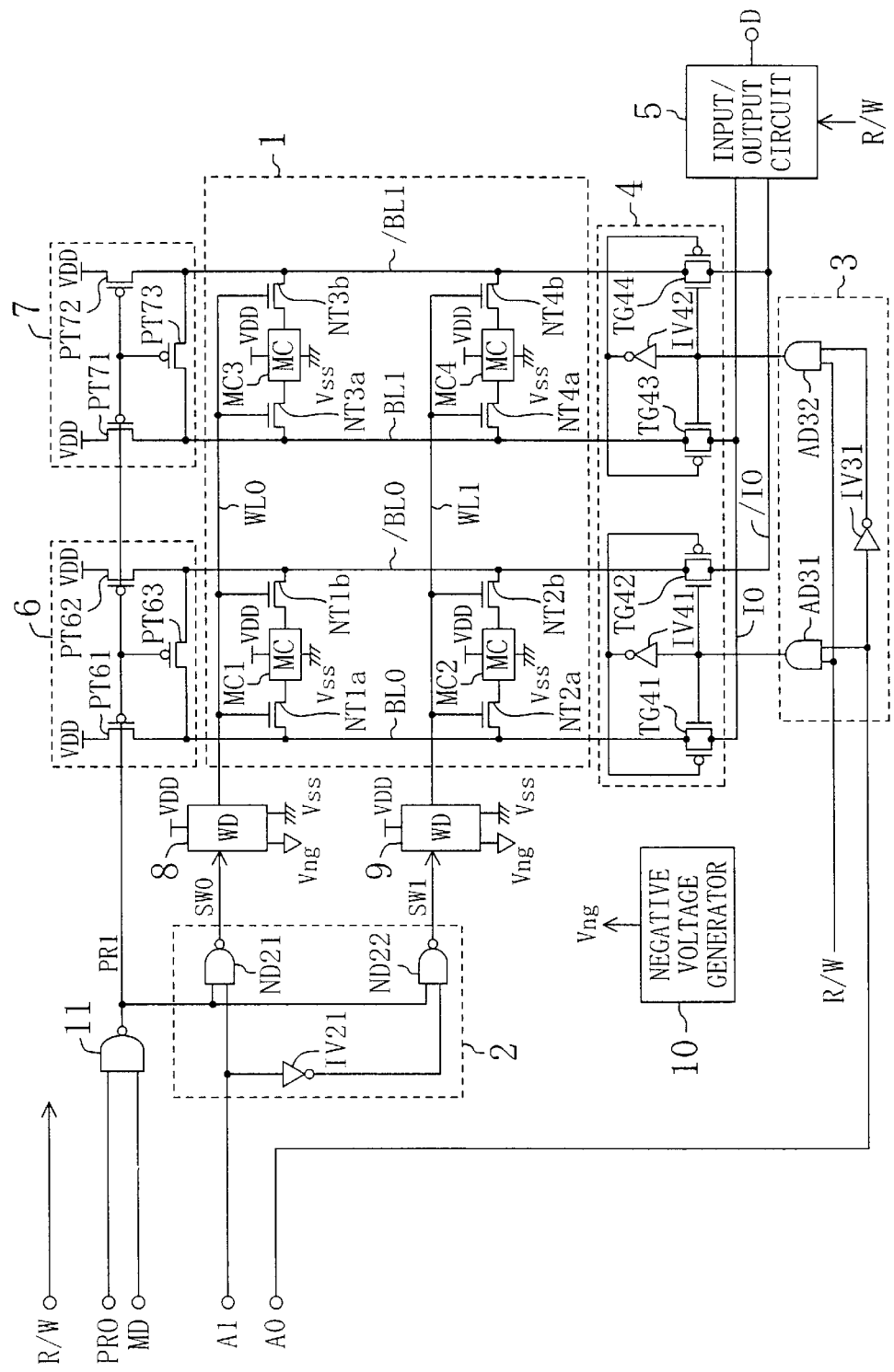
FIG. 1 is a circuit diagram illustrating an overall configuration for an SRAM according to a first embodiment of the present invention.

Hereinafter, preferred embodiments of the present invention will be described in detail with reference to the accompanying drawings, in which components having like or the same function will be identified by the same reference numeral for the sake of simplicity of description.

EMBODIMENT 1

SRAM configuration

FIG. 1 is a circuit diagram illustrating an overall configuration for an SRAM according to a first embodiment of the present invention. As shown in FIG. 1, the SRAM includes memory array 1, row decoder 2, column decoder 3, column selector 4, input/output circuit 5, precharge circuits 6 and 7, word drivers 8 and 9, negative voltage generator 10 and NAND gate 11.

The memory array 1 includes memory cells MC1 through MC4, word lines WL0 and WL1, two pairs of complementary bit lines BL0, /BL0 and BL1, /BL1, and access transistors NT1a through NT4a and NT1b through NT4b. The memory cells MC1 through MC4 are arranged in matrix, or in columns and rows. The word line WL0 is associated with the memory cells MC1 and MC3, while the word line WL1 is associated with the memory cells MC2 and MC4. One pair of bit lines BL0, /BL0 is associated with the memory cells MC1 and MC2, while the other pair of bit lines BL1, /BL1 is associated with the memory cells MC3 and MC4. Each of the access transistors NT1a through NT4a and NT1b through NT4b has a low threshold voltage. Specifically, in each of these access transistors NT1a through NT4a and NT1b through NT4b, when there is a potential difference of 0 V between the gate and source of the transistor, a current of 100 pA/$\mu$m or more flows between its drain and source. The access transistor NT1a is connected between a data retention node (not shown in FIG. 1) of the associated memory cell MC1 and the bit line BL0 and receives a voltage on the word line WL0 at its gate. The access transistor NT1b is connected between another data retention node (not shown in FIG. 1) of the associated memory cell MC1 and the bit line /BL0 and receives the voltage on the word line WL0 at its gate. The access transistor NT2a is connected between a data retention node (not shown in FIG. 1) of the associated memory cell MC2 and the bit line BL0 and receives a voltage on the word line WL1 at its gate. The access transistor NT2b is connected between another data retention node (not shown in FIG. 1) of the associated memory cell MC2 and the bit line /BL0 and receives the voltage on the word line WL1 at its gate. The access transistor NT3a is connected between a data retention node (not shown in FIG. 1) of the associated memory cell MC3 and the bit line BL1 and receives the voltage on the word line WL0 at its gate. The access transistor NT3b is connected between another data retention node (not shown in FIG. 1) of the associated memory cell MC3 and the bit line /BL1 and receives the voltage on the word line WL0 at its gate. The access transistor NT4a is connected between a data retention node (not shown in FIG. 1) of the associated memory cell MC4 and the bit line BL1 and receives the voltage on the word line WL1 at its gate. The access transistor NT4b is connected between another data retention node (not shown in FIG. 1) of the associated memory cell MC4 and the bit line /BL1 and receives the voltage on the word line WL1 at its gate.

The NAND gate 11 outputs a negated logical product of a mode signal MD and a precharge control signal PRO as a precharge signal PR1.

The row decoder 2 includes an inverter IV21 and two NAND gates ND21 and ND22. The inverter IV21 inverts an address signal A1. The NAND gate ND21 outputs a negated logical product of the precharge signal PR1 and the address signal A1 as a word line select signal SW0. The NAND gate ND22 outputs a negated logical product of the precharge signal PR1 and the output of the inverter IV21 as a word line select signal SW1.

The negative voltage generator 10 generates a negative voltage Vng.

The word drivers 8 and 9 together makes word line driving means as defined in the appended claims. Responsive to the word line select signal SW0 or SW1, each of these word drivers 8 and 9 selectively outputs supply voltage VDD, ground voltage Vss or negative voltage Vng to the associated word line WL0 or WL1.

The column decoder 3 includes an inverter IV31 and two AND gates AD31 and AD32. The inverter IV31 inverts an address signal A0. The AND gate AD31 outputs a logical product of the address signal A0 and an access signal R/W. The AND gate AD32 outputs a logical product of the output of the inverter IV31 and the access signal R/W.

The column selector 4 includes inverters IV41 and IV42 and transfer gates TG41 through TG44. The inverters IV41 and IV42 invert the outputs of the AND gates AD31 and AD32, respectively. The transfer gates TG41 and TG42 are connected between the bit line BL0 and an input/output line IO and between the bit line /BL0 and an input/output line /IO, respectively. Responsive to the output of the AND gate AD31, the transfer gate TG41 connects or disconnects the bit line BL0 to/from the input/output line IO and the transfer gate TG42 connects or disconnects the bit line /BL0 to/from the input/output line /IO. In the same way, responsive to the output of the AND gate AD32, the transfer gate TG43 connects or disconnects the bit line BL1 to/from the input/output line IO and the transfer gate TG44 connects or disconnects the bit line /BL1 to/from the input/output line /IO.

Responsive to the access signal R/W, the input/output circuit 5 transmits data, read out on the input/output line IO or /IO, to an input/output terminal D or another data, externally input to the input/output terminal D, to the input/output line IO or /IO.

The precharge circuit 6 includes p-channel MOS transistors PT61 through PT63. The p-channel MOS transistors PT61 and PT62 are connected between a power supply node receiving the supply voltage VDD and the pair of bit lines BL0 and /BL0, respectively, and turn ON/OFF responsive to the precharge signal PR1. The p-channel MOS transistor PT63 is connected between the pair of bit lines BL0 and /BL0 and also turns ON/OFF responsive to the precharge signal PR1.

The precharge circuit 7 includes p-channel MOS transistors PT71 through PT73. The p-channel MOS transistors PT71 and PT72 are connected between the power supply node receiving the supply voltage VDD and the pair of bit lines BL1 and /BL1, respectively, and turn ON/OFF responsive to the precharge signal PR1. The p-channel MOS transistor PT73 is connected between the pair of bit lines BL1 and /BL1 and also turns ON/OFF responsive to the precharge signal PR1.

Figure 2:
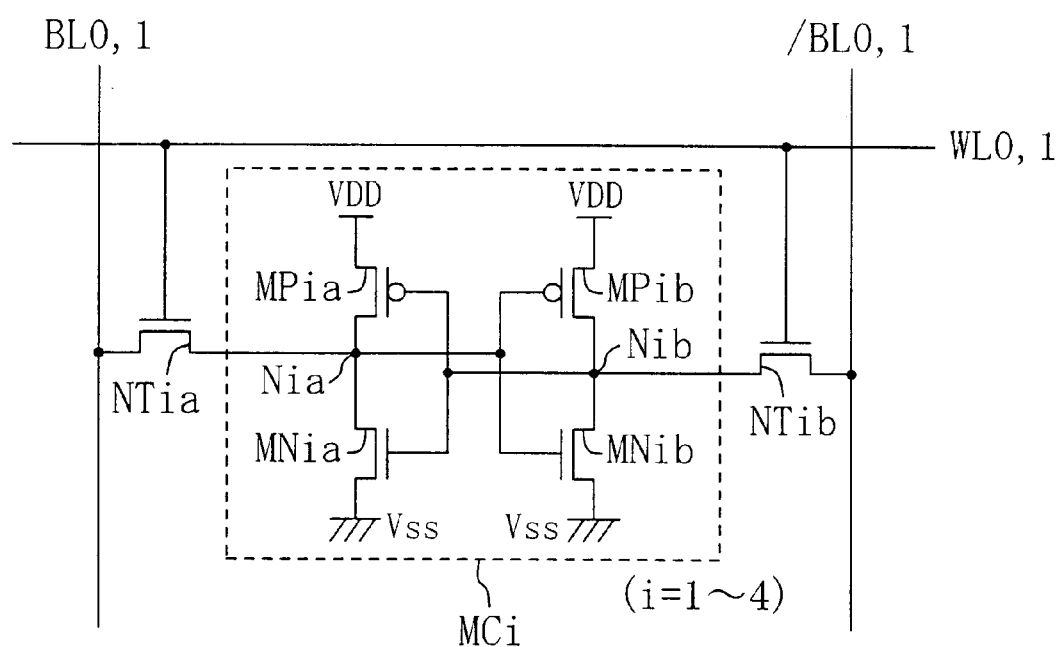
FIG. 2 is a circuit diagram illustrating a configuration for the memory cell shown in FIG. 1.

FIG. 2 illustrates a specific configuration for the memory cells MC1 through MC4 shown in FIG. 1. As shown in FIG. 2, the memory cell MC1 includes p-channel MOS transistors MPia and MPib and n-channel MOS transistors MNia and MNib (where $1 \leq i \leq 4$).

The p-channel MOS transistor MPia is connected between the power supply node, receiving the supply voltage VDD, and a data retention node Nia. The n-channel MOS transistor MNia is connected between the data retention node Nia and a ground node receiving the ground voltage Vss. The gates of the p- and n-channel MOS transistors MPia and MNia are connected to another data retention node Nib. The p-channel MOS transistor MPib is connected between the power supply node and the data retention node Nib. The n-channel MOS transistor MNib is connected between the data retention node Nib and the ground node. The gates of the p- and n-channel MOS transistors MPib and MNib are connected to the data retention node Nia.

In the memory cell MC1 with such a configuration, a one-bit complementary data signal is stored at each of the data retention nodes Nia and Nib.

As shown in FIG. 2, each access transistor NTia (where $1 \leq i \leq 4$) is connected between the bit line BL0 or BL1 and its associated data retention node Nia, while each access transistor NTib is connected between the bit line /BL0 or /BL1 and its associated data retention node Nib.

Figure 3:
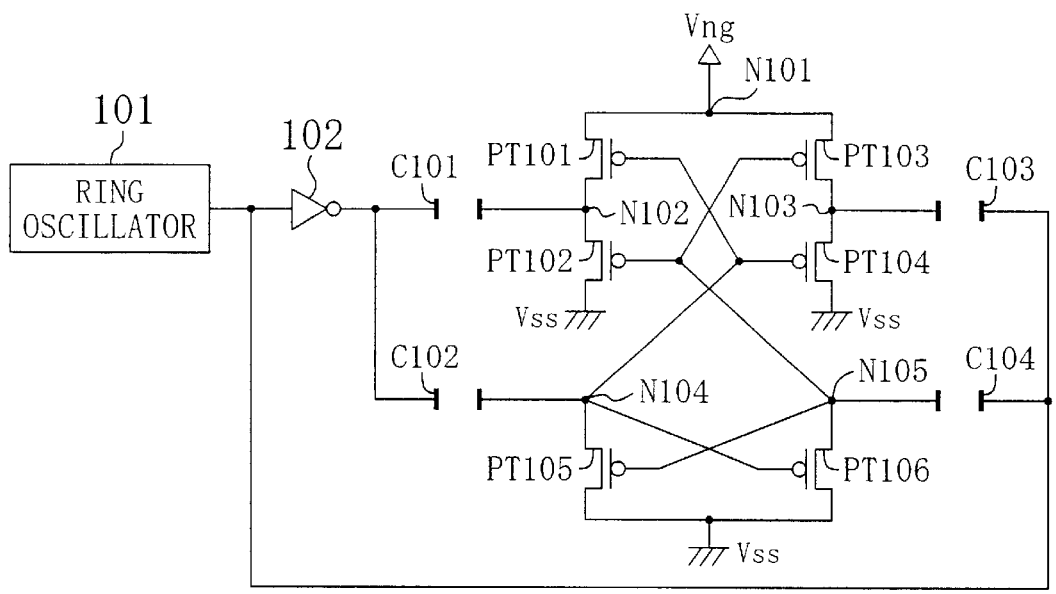
FIG. 3 is a circuit diagram illustrating a configuration for the negative voltage generator shown in FIG. 1.

FIG. 3 illustrates a specific configuration for the negative voltage generator 10 shown in FIG. 1. As shown in FIG. 3, the negative voltage generator 10 includes ring oscillator 101, inverter 102, capacitors C101 through C104 and p-channel MOS transistors PT11 through PT106.

The ring oscillator 101 includes multiple inverters (not shown), which are connected together to form an odd number of stages, and outputs a signal with a predetermined oscillation frequency. The inverter 102 inverts the output signal of the ring oscillator 101. The capacitor C101 is connected between the output node of the inverter 102 and a node N102. The capacitor C102 is connected between the output node of the inverter 102 and a node N104. The capacitor C103 is connected between the output node of the ring oscillator 101 and a node N103. And the capacitor C104 is connected between the output node of the ring oscillator 101 and a node N105.

The p-channel MOS transistor PT101 is connected between a node N101 and the node N102. The p-channel MOS transistor PT102 is connected between the node N102 and the ground node receiving the ground voltage Vss. The p-channel MOS transistor PT103 is connected between the nodes N101 and N103. The p-channel MOS transistor PT104 is connected between the node N103 and the ground node. The p-channel MOS transistor PT105 is connected between the node N104 and the ground node. And the p-channel MOS transistor PT106 is connected between the node N105 and the ground node. The gates of the p-channel MOS transistors PT101 and PT104 are coupled together and also connected to the node N104. The gates of the p-channel MOS transistors PT102 and PT103 are coupled together and also connected to the node N105. The gate of the p-channel MOS transistor PT105 is connected to the node N105. And the gate of the p-channel MOS transistor PT106 is connected to the node N104.

The negative voltage generator with such a configuration performs charge pumping and generates the negative voltage Vng at the node N101 synchronously with the rise or fall of the output signal of the ring oscillator 101.

Figure 4:
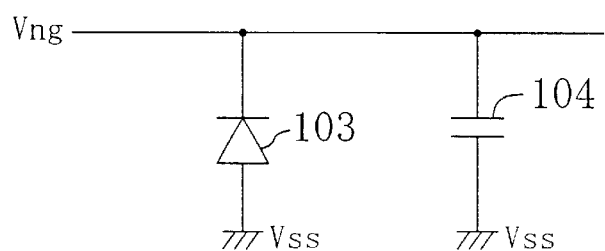
FIG. 4 illustrates a capacitor and a diode associated with a node receiving a negative voltage.

The charge supplied to the node N101 when the negative voltage Vng is generated is stored on the capacitor 104 shown in FIG. 4. The capacitor 104 may be a capacitance associated with a gate oxide film, an interconnect capacitance or a coupling capacitance associated with a word line.

The potential level of the negative voltage Vng is clamped to an intermediate level between a built-in voltage level and the ground voltage level Vss by the pn junction diode 103 shown in FIG. 4. This intermediate potential level is controllable to a desired level by a known analog technique (e.g., a combination of monitor and reference circuits). It is expected that the level is often set to a range from −0.3 V to −0.5 V in accordance with the characteristic of a GIDL current (to be described later).

Figure 5:
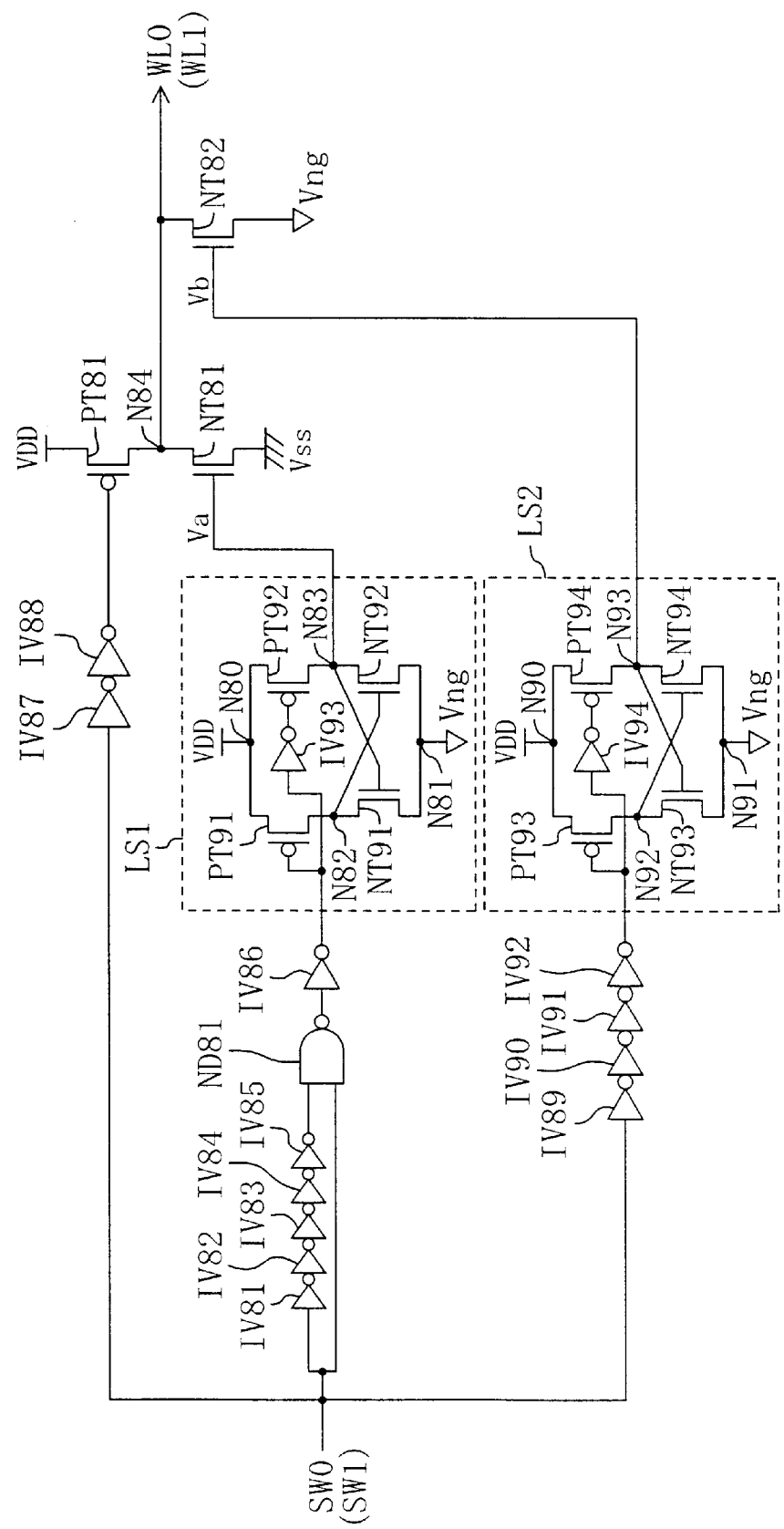
FIG. 5 is a circuit diagram illustrating a configuration for the word driver shown in FIG. 1.

FIG. 5 illustrates a specific configuration for the word drivers 8 and 9 shown in FIG. 1. Since the word drivers 8 and 9 have the same configuration, only the word driver 8 is illustrated in FIG. 5. As shown in FIG. 5, the word driver 8 includes inverters IV81 through IV92, NAND gate ND81, level shifters LS1 and LS2, p-channel MOS transistor PT81 and n-channel MOS transistors NT81 and NT82.

The inverters IV81 through IV85 are connected in series together. The word line select signal SW0 is supplied to the input terminal of the inverter IV81. The output terminal of the inverter IV85 is connected to one of the two input terminals of the NAND gate ND81. The series of inverters IV81 through IV85 delays the word line select signal SW0 for a predetermined amount of time and then provides the delayed signal to one of the two input terminals of the NAND gate ND81. The NAND gate ND81 outputs a negated logical product of the output of the inverter IV85 and the word line select signal SW0. The inverter IV86 inverts the output of the NAND gate ND81. The inverter IV87 inverts the word line select signal SW0. The inverter IV88 inverts the output of the inverter IV87. The inverters IV89 through IV92 are also connected in series together. The word line select signal SW0 is also supplied to the input terminal of the inverter IV89. The series of inverters IV89 through IV92 delays the word line select signal SW0 for another predetermined amount of time and then outputs the delayed signal.

The level shifter LS1 includes p-channel MOS transistors PT91 and PT92, n-channel MOS transistors NT91 and NT92 and inverter IV93.

The p-channel MOS transistor PT91 is connected between a node N80 receiving the supply voltage VDD and a node N82 and receives the output of the inverter IV86 at its gate. The n-channel MOS transistor NT91 is connected between the node N82 and a node N81 receiving the negative voltage Vng. The gate of the n-channel MOS transistor NT91 is connected to a node N83. The inverter IV93 inverts the output of the inverter IV86. The p-channel MOS transistor PT92 is connected between the nodes N80 and N83 and receives the output of the inverter IV93 at its gate. The n-channel MOS transistor NT92 is connected between the nodes N83 and N81. The gate of the n-channel MOS transistor NT92 is connected to the node N82.

The level shifter LS2 includes p-channel MOS transistors PT93 and PT94, n-channel MOS transistors NT93 and NT94 and inverter IV94.

The p-channel MOS transistor PT93 is connected between a node N90 receiving the supply voltage VDD and a node N92 and receives the output of the inverter IV92 at its gate. The n-channel MOS transistor NT93 is connected between the node N92 and a node N91 receiving the negative voltage Vng. The gate of the n-channel MOS transistor NT93 is connected to a node N93. The inverter IV94 inverts the output of the inverter IV92. The p-channel MOS transistor PT94 is connected between the nodes N90 and N93 and receives the output of the inverter IV94 at its gate. The n-channel MOS transistor NT94 is connected between the nodes N93 and N91. The gate of the n-channel MOS transistor NT94 is connected to the node N92.

The p- and n-channel MOS transistors PT81 and NT81 are connected in series together between a power supply node receiving the supply voltage VDD and a ground node receiving the ground voltage Vss. The p-channel MOS transistor PT81 receives the output of the inverter IV88 at its gate. The gate of the n-channel MOS transistor NT81 receives a voltage Va at the node N83. A voltage at an interconnect node between the p- and n-channel MOS transistors PT81 and NT81 is supplied onto the word line WL0.

The n-channel MOS transistor NT82 is connected between the interconnect node N84 and a node receiving the negative voltage Vng. The gate of the n-channel MOS transistor NT82 receives a voltage at the node N93.

Hereinafter, it will be described with reference to FIG. 6 how the word driver 8 with such a configuration operates.

Figure 6:
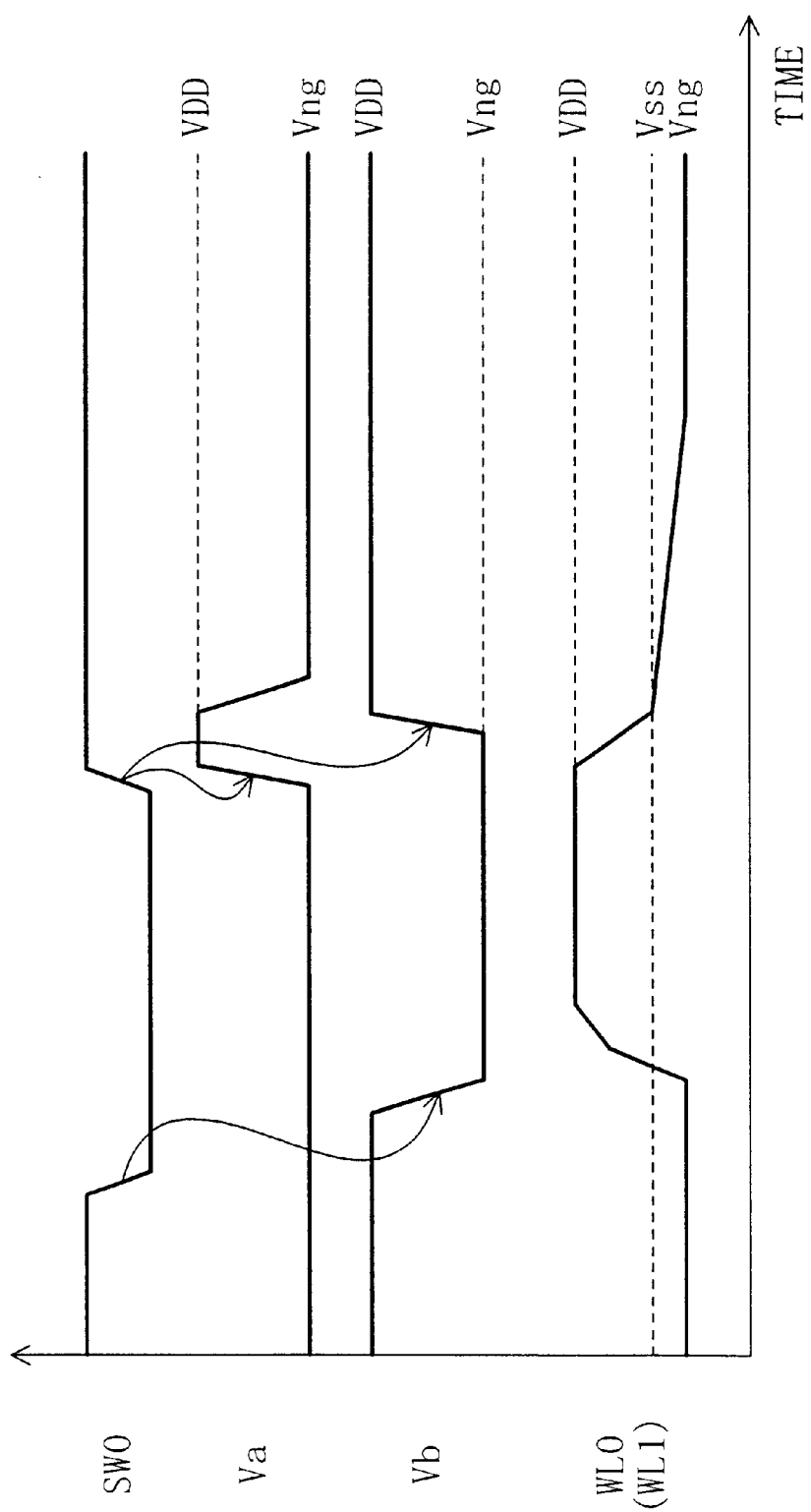
FIG. 6 is a timing diagram illustrating how the word driver shown in FIG. 5 operates.

As shown in FIG. 6, while the word line select signal SW0 is in logical one state (which will be herein called "at H-level"), the levels of the voltages Va and Vb at the nodes N83 and N93 are equal to those of the negative voltage Vng and supply voltage VDD, respectively. Accordingly, the n-channel MOS transistors NT81 and NT82 are OFF and ON, respectively, and the p-channel MOS transistor PT81 is OFF.

When the word line select signal SW0 falls from H-level (i.e., logical one) to L-level (i.e., logical zero), the p-channel MOS transistor PT81 turns ON. Also, the voltage Vb at the node N93 falls to the Vng level, thereby turning OFF the n-channel MOS transistor NT82. As a result, the voltage at the node N84, i.e., the voltage on the word line WL0, rises from the Vng level to the VDD level.

Thereafter, when the word line select signal SW0 rises from L-level to H-level, the p-channel MOS transistor PT81 turns OFF. Also, synchronously with the rise of the word line select signal SW0, a one-shot pulse is applied as the voltage Va to the node N83. Responsive to the one-shot pulse, the n-channel MOS transistor NT81 turns ON and will be kept ON for a certain period of time. As a result, the node N84 is discharged. That is to say, the voltage on the word line WL0 drops from the VDD level to the Vss level. After the voltage Va at the node N83 has risen, the voltage Vb at the node N93 rises to the VDD level, thereby turning ON the n-channel MOS transistor NT82. Consequently, the voltage on the word line WL0 further drops from the Vss level to the Vng level.

As described above, the word driver 8 once gets the word line WL0 rapidly discharged to the Vss level by the n-channel MOS transistor NT81. Thereafter, the n-channel MOS transistor NT82 is turned ON, thereby redistributing the charge that has been stored on the capacitor 104 shown in FIG. 4 in such a manner that the voltage on the word line WL0 drops from the Vss level to the Vng level. In this manner, the voltage on the word line can be pulled down at a high speed without dissipating charge in vain. That is to say, the power dissipated by the negative voltage generator 10 can be reduced.

SRAM operation

Figure 7:
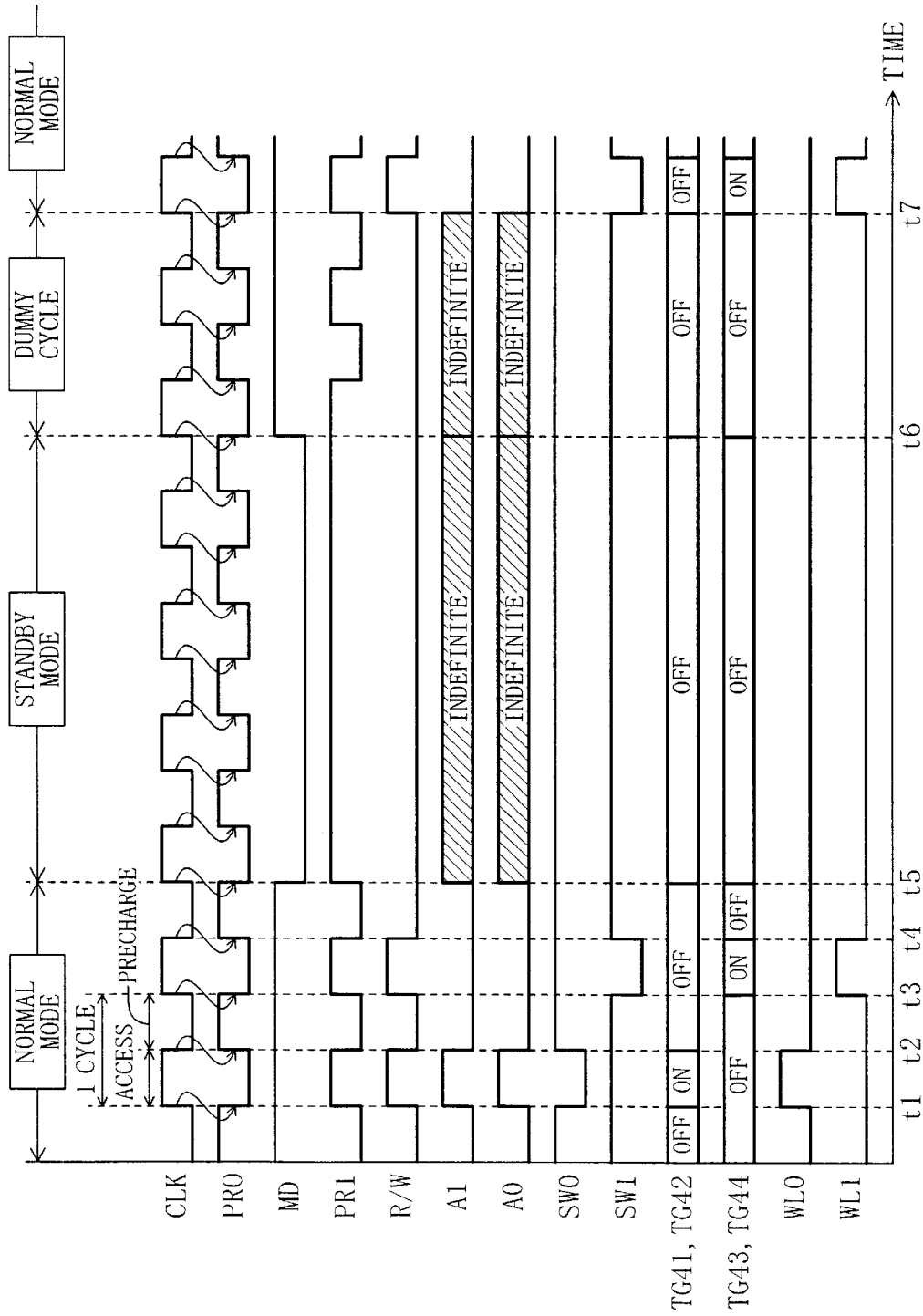
FIG. 7 is a timing diagram illustrating how the SRAM shown in FIG. 1 operates.

Next, it will be described with reference to FIGS. 1 and 7 how the SRAM with such a configuration operates. FIG. 7 is a timing diagram illustrating how the SRAM shown in FIG. 1 operates. In the following description, the operation of the SRAM in (1) its normal mode and (2) its standby mode will be detailed separately.

(1) Normal Mode Operation

While the mode signal MD is at H-level, the SRAM operates in the normal mode. The "normal mode operation" herein refers to a period in which a memory cell MCI is accessed. The SRAM is controlled so that a memory cell MCI is accessed during the first half of one cycle of the precharge signal PR0 and that precharging is carried out during the second half of one cycle of the precharge signal PR0 in preparation for the next cycle. The precharge signal PR0 is externally supplied to the SRAM synchronously with an external clock signal CLK. The external clock signal CLK is used as a reference signal for operation.

At a time t1, the precharge signal PR0 falls from H-level to L-level. In response, the precharge signal PR1 rises to H-level, and the access signal R/W also rises from L-level to H-level. To access the memory cell MC1, for example, as shown in FIG. 1, the address signals A0 and A1 both rise to H-level. Since both of the address and precharge signals A1 and PR1 are now at H-level, the word line select signal SW0 falls to L-level. In response, the word driver 8 activates the word line WL0 and the voltage on the word line WL0 reaches the VDD level (see FIG. 6). Then, the n-channel MOS transistors NT1a and NT1b turn ON, thereby connecting the data retention nodes N1a and N1b of the memory cell MC1 to the bit lines BL0 and /BL0, respectively (see FIG. 2).

On the other hand, since both of the address and access signals A0 and R/W are now at H-level, the transfer gates TG41 and TG42 turn ON. As a result, the bit lines BL0 and /BL0 are connected to the input/output lines IO and /IO, respectively.

In reading out data from the memory cell MC1, the complementary data, stored at the data retention nodes Nia and Nib, is read out onto the bit lines BL0 and /BL0 and input/output lines IO and /IO and then transmitted by the input/output circuit 5 to the input/output terminal D.

In writing data on the memory cell MC1, the input/output circuit 5 transmits the data, which has been input to the input/output terminal D, through the input/output lines IO and /IO and then bit lines BL0 and /BL0. As a result, the data signal, which has been read out from the memory cell MC1 onto the bit line BL0 and /BL0, is rewritten.

Next, at a time t2, the precharge signal PR0 rises to H-level. In response, the precharge, access and address signals PR1, R/W, A1 and A0 all fall to L-level, and the transfer gates TG41 and TG42 turn OFF. Also, the word line select signal SW0 rises to H-level so that the voltage on the word line WL0 drops to the Vng level (see FIG. 6). As a result, the n-channel MOS transistors NT1a and NT1b turn OFF.

When the precharge signal PR1 falls to L-level, the p-channel MOS transistors PT61 through PT63 and PT71 through PT73 in the precharge circuits 6 and 7 all turn ON. As a result, the two pairs of bit lines BL0, /BL0 and BL1, /BL1 are connected to the power supply nodes receiving the supply voltage VDD so as to be precharged to the VDD level. Furthermore, the p-channel MOS transistor PT63 equalizes the potential levels on the bit lines BL0 and /BL0 with each other, while the p-channel MOS transistor PT73 equalizes the potential levels on the bit lines BL1 and /BL1 with each other. In this manner, the precharge operation is completed and the SRAM is ready to the access that will be performed between times t3 and t4. As for the next one cycle between the times t3 and t5, the access and precharge operations will also be performed in a similar manner.

(2) Standby Mode Operation

While the mode signal MD is at L-level, the SRAM is in the standby mode. As used herein, the "standby mode" refers to a period in which memory cells are accessed one-tenth or less as frequent as the normal mode.

At a time t5, the mode signal MD falls from H-level to L-level and the SRAM enters the standby mode.

Once the mode signal MD has fallen to L-level, the precharge signal PR1 is always at H-level no matter whether the precharge signal PR0 is zero or one. Synchronously with the rise of the precharge signal PR1, the p-channel MOS transistors PT61 through PT63 and PT71 through PT73 in the precharge circuits 6 and 7 turn OFF. As a result, the two pairs of bit lines BL0, /BL0 and BL1, /BL1 are electrically disconnected from the power supply nodes receiving the supply voltage VDD. That is to say, the precharge operation is aborted.

Also, the word line select signals SW0 and SW1 are both at H-level, and the voltages on the word lines WL0 and WL1 are at the Vng level.

Furthermore, since the access signal R/W is at L-level, the transfer gates TG41 through TG44 are all OFF. As a result, the two pairs of bit lines BL0, /BL0 and BL1, /BL1 are electrically disconnected from the pair of input/output lines IO and /IO.

The SRAM will be kept in this standby mode until a time t6.

Normally, an SRAM is controlled in such a manner as to perform an access operation during the first half of one cycle and a precharge operation during the second half thereof in preparation for the next cycle. Accordingly, if the precharge operation has been aborted halfway to get the SRAM to enter the standby mode compulsorily, then the SRAM cannot start its next normal mode operation at the beginning of the first half of the next one cycle, i.e., so soon as the standby mode operation is over. However, it usually takes a several milliseconds' delay (i.e., a power stabilizing period to be described later) for a mobile electronic unit including an SRAM to return from the standby state (or standby mode) to the normal operation state (or normal mode). Accordingly, if several dummy cycles are provided for this interval, then there will be no problem because all the bit lines can be precharged completely. For that reason, dummy cycles are also provided for the SRAM of the present invention between the times t6 and t7.

If no such dummy cycles were allowable, the above problem could be avoidable by changing the method of controlling the memory in such a manner that precharge is performed during the first half of one cycle and that access is performed during the second half thereof. In such a case, however, it would take a longer time after an access request has been issued and before the desired data is actually output. Accordingly, the operation like that is effective only in low-speed applications.

How current dissipated can be reduced in standby mode

Next, it will be described how the current dissipated can be reduced in the standby mode. This effect will be described only on the memory cells MC1 and MC2 for the sake of simplicity.

Figure 8:
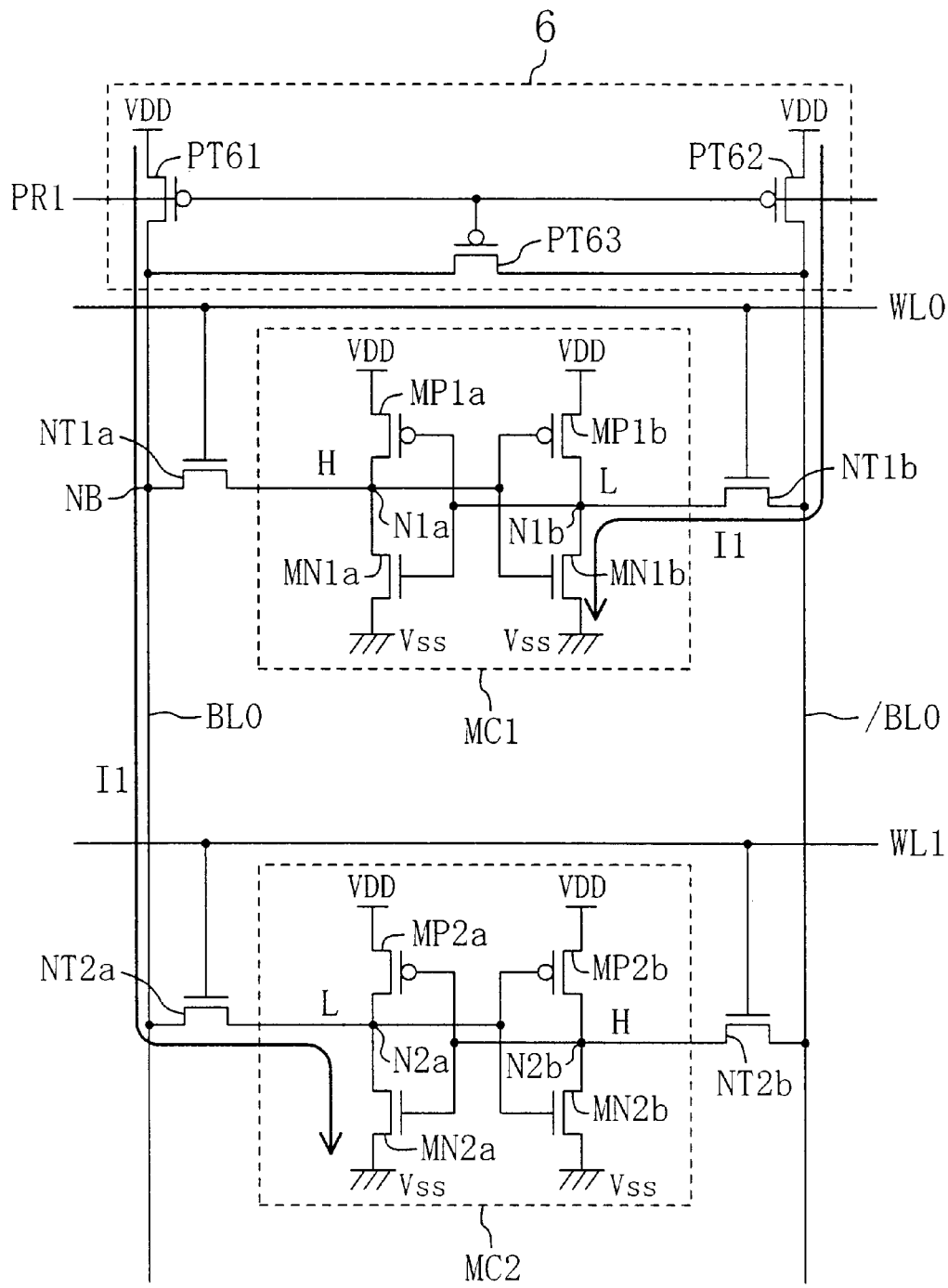
FIG. 8 is a circuit diagram illustrating how the amount of current dissipated can be reduced in a standby mode.

In a known SRAM, the p-channel MOS transistors PT61 through PT63 in the precharge circuit 6 are turned ON during its standby mode operation, thereby precharging the bit lines BL0 and /BL0 to the VDD level shown in FIG. 8. Also, an L-level voltage (i.e., 0 V) is supplied onto the word lines WL0 and WL1. Accordingly, a leakage current I1 flows from the power supply nodes, receiving the supply voltage VDD, into the ground nodes of the memory cells MC1 and MC2 by way of the access transistors NT1b and NT2a, respectively.

This leakage current I1 flows from the power supply nodes into the L-level data retention nodes of all memory cells. Accordingly, a total leakage current I1, flowing through the entire SRAM, is obtained by multiplying together the number of memory cells and a leakage current flowing through each access transistor. Only two memory cells MC1 and MC2 are illustrated in FIG. 8. However, supposing a leakage current of 0.1 µA flows through each access transistor, for example, a current of 100 mA in total flows through an SRAM including one million memory cells. If an SRAM dissipates that great amount of current in its standby mode, such an SRAM is far from being qualified for a battery-driven mobile electronic unit of a small size.

According to a technique of reducing the leakage current I1, a negative voltage of −0.3 V, for example, is applied to the gates of the access transistors NT1b and NT2a. In this method, the source (i.e., the L-level data retention node N1b or N2a) and the gate of the access transistor NT1b or NT2a is reverse biased, thus reducing the leakage current I1.

Figure 9:
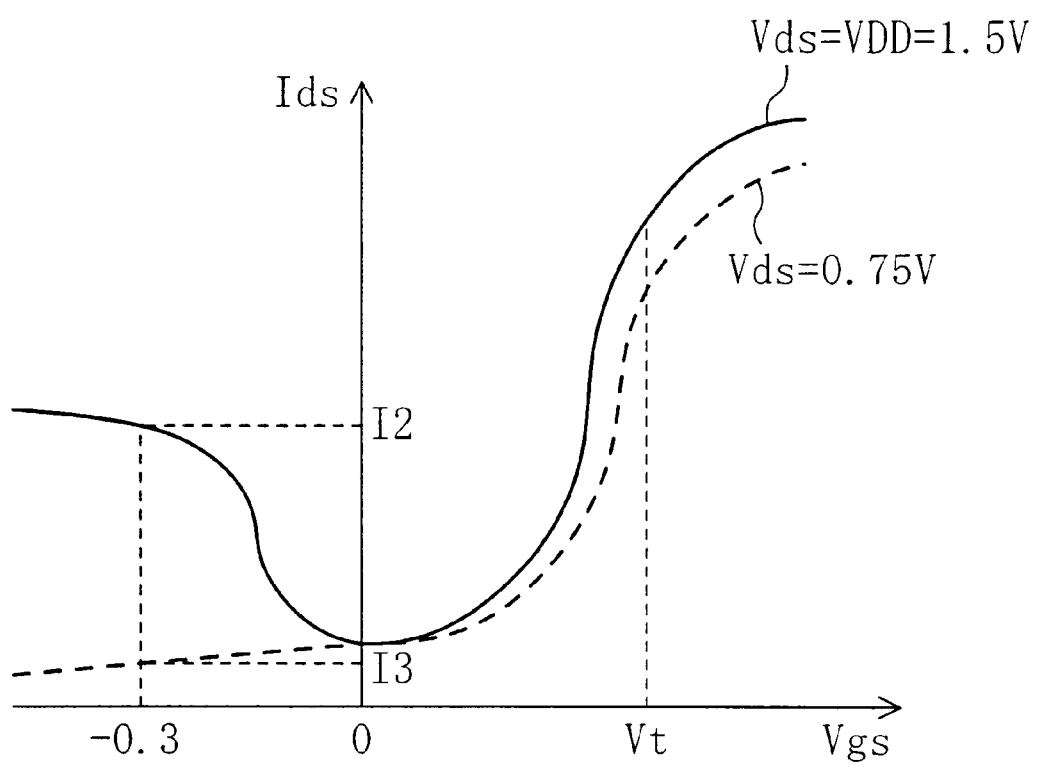
FIG. 9 is a graph illustrating a GIDL current.

However, since transistors have been further downsized recently, a different type of problem, or a gate-induced-drain-leakage (GIDL) current, newly arises. As shown in FIG. 9, if the gate voltage Vgs is negative and if the drain voltage Vds is approximately equal to the supply voltage VDD, then a considerable amount of GIDL current flows. To avoid this problem, it is effective to reduce the drain voltage Vds.

If a negative voltage of −0.3 V, for example, is applied to the gate of the access transistor NT1b or NT2a, then a negative potential difference between the gate and drain thereof increases its magnitude. This is because the bit lines BL0 and /BL0 have been precharged to the VDD level. For example, where the supply voltage VDD is 1.5 V, the gate-drain voltage Vgd=−0.3−1.5=−1.8 V. Accordingly, a GIDL current I2 flows unintentionally and the current dissipated in the standby mode cannot be reduced.

To solve this GIDL current problem, the SRAM of the first embodiment turns OFF the p-channel MOS transistors PT61 through PT63 and PT71 through PT73 of the precharge circuits 6 and 7 in the standby state so that the bit lines BL0, /BL0 and BL1, /BL1 are electrically disconnected from the power supply nodes receiving the supply voltage VDD.

Figure 10:
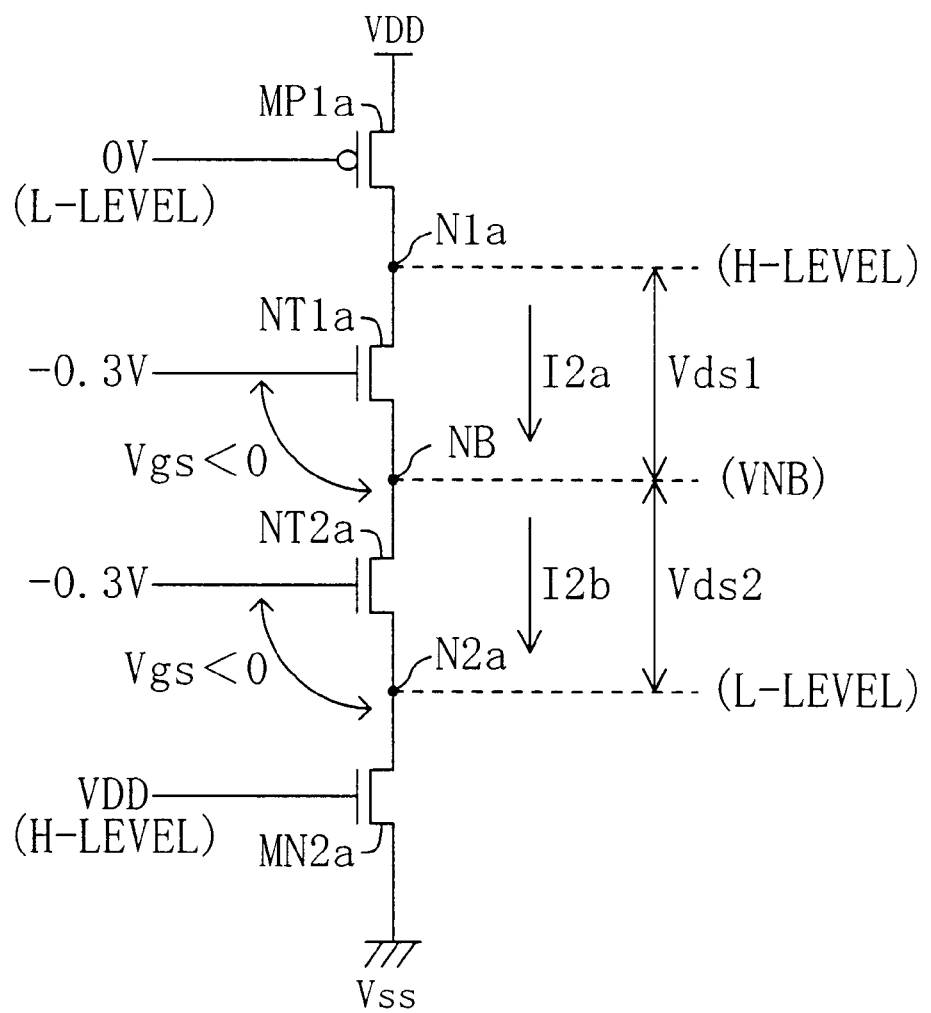
FIG. 10 illustrates how the amount of current dissipated can be reduced in a standby mode.

The potential level on these pairs of bit lines BL0, /BL0 and BL1, /BL1, which are electrically disconnected from the power supply nodes, is lower than the VDD level, because no power is supplied thereto from the power supply nodes. Usually, the potential level is stabilized at around an intermediate potential level (=½ VDD). Hereinafter, this phenomenon will be described with reference to FIG. 10. FIG. 10 illustrates the p-channel MOS transistor MP1a, access transistors NT1a and NT2a and n-channel MOS transistor MN2a shown in FIG. 8. When the precharge operation is aborted, the voltage VBN on the bit line BL0 is stabilized at around the intermediate potential level (e.g., about 0.75 V when VDD=1.5 V). Accordingly, the drain voltage Vds2 of the access transistor NT2a becomes about 0.75 V. As a result, the current I2b, flowing through the access transistor NT2a, decreases from I2 to I3 as shown in FIG. 9. Also, the drain voltage Vds1 of the access transistor NT1a, which is connected to the H-level data retention node N1a, also becomes about 0.75 V. As a result, the current I2a, flowing through the access transistor NT1a, also decreases from I2 to I3 as shown in FIG. 9.

In this manner, by electrically disconnecting the bit lines BL0, /BL0 and BL1, /BL1 from the power supply nodes, the access transistors, connected to the L- and H-level data retention nodes, respectively, can have their source-drain voltages decreased to such a level as not causing the GIDL current problem.

As described above, according to the first embodiment, the negative voltage Vng is supplied onto the word line WL0 or WL1 and the bit lines BL0, /BL0 and BL1, /BL1 are electrically disconnected from the power supply nodes in the standby state. Thus, the current dissipated in the standby mode can be reduced while eliminating the GIDL current.

EMBODIMENT 2

Figure 11:
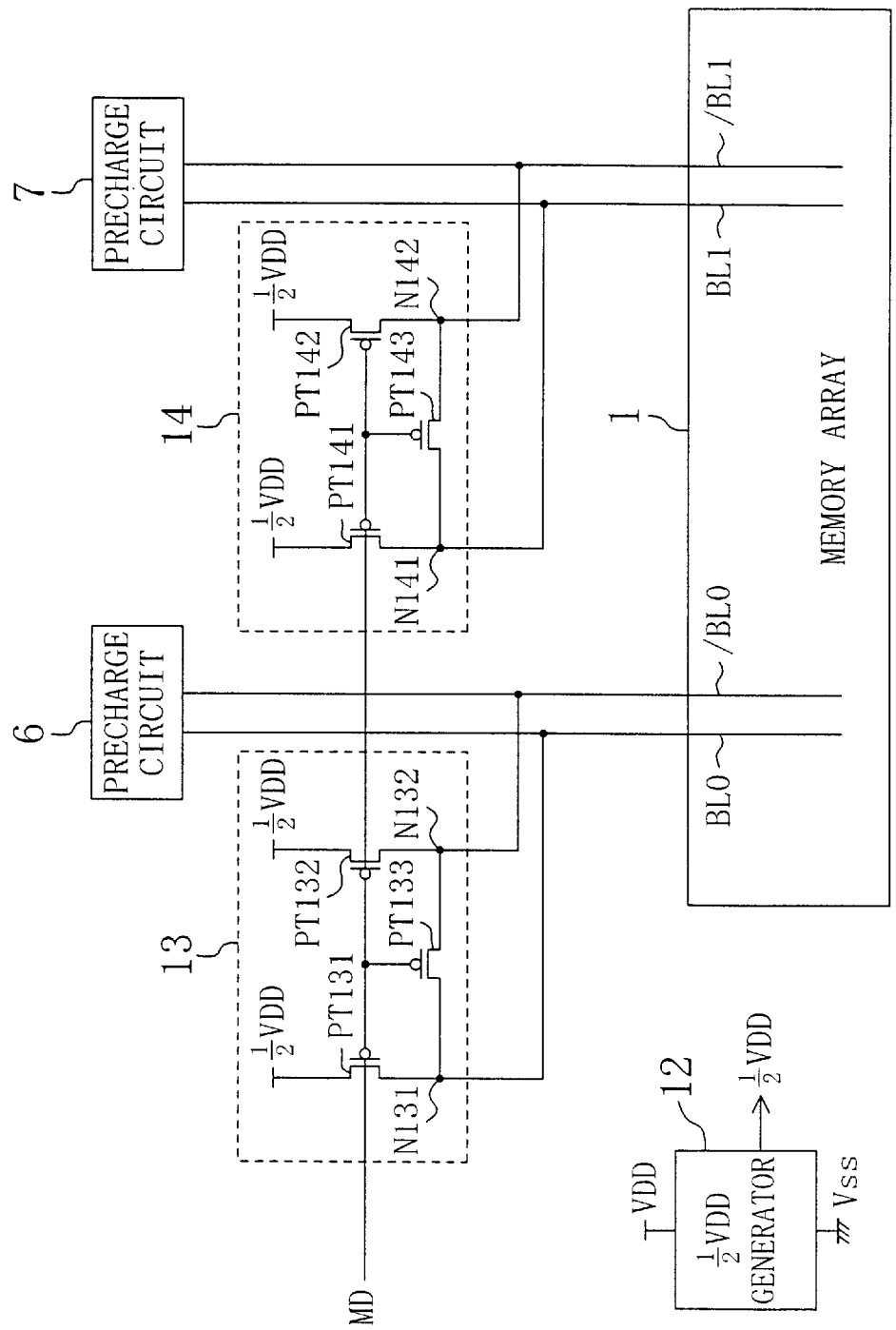
FIG. 11 is a diagram illustrating a configuration for an SRAM according to a second embodiment of the present invention.

As shown in FIG. 11, an SRAM according to a second embodiment of the present invention further includes a ½ VDD generator 12 and level holders 13 and 14 in addition to all the components shown in FIG. 1.

The ½ VDD generator 12 is a well-known circuit. Specifically, the circuit 12 receives a supply voltage VDD and generates ½ VDD, which is half as high as the supply voltage VDD.

The level holder 13 includes p-channel MOS transistors PT131 through PT133. The p-channel MOS transistor PT131 is connected between a node receiving the ½ VDD and a node N131 and turns ON or OFF responsive to the mode signal MD. The p-channel MOS transistor PT132 is connected between a node receiving the ½ VDD and a node N132 and also turns ON or OFF responsive to the mode signal MD. The nodes N131 and N132 are connected to the bit lines BL0 and /BL0, respectively. The p-channel MOS transistor PT133 is connected between these nodes N131 and N132 and turns ON or OFF responsive to the mode signal MD.

The level holder 14 includes p-channel MOS transistors PT141 through PT143. The p-channel MOS transistor PT141 is connected between a node receiving the ½ VDD and a node N141 and turns ON or OFF responsive to the mode signal MD. The p-channel MOS transistor PT142 is connected between a node receiving the ½ VDD and a node N142 and also turns ON or OFF responsive to the mode signal MD. The nodes N141 and N142 are connected to the bit lines BL1 and /BL1, respectively. The p-channel MOS transistor PT143 is connected between these nodes N141 and N142 and turns ON or OFF responsive to the mode signal MD.

While this SRAM is in the standby mode, the p-channel MOS transistors PT131 through PT133 and PT141 through PT143 are ON, thereby holding the potential on the pairs of bit lines BL0, /BL0 and BL1, /BL1 at the ½ VDD level. As a result, the current dissipated in the standby mode can also be reduced as in the first embodiment. In addition, the following effects are also attainable.

According to the first embodiment, the pairs of bit lines BL0, /BL0 and BL1, /BL1 are floating, and therefore the voltage levels thereof are not constant. For that reason, the precharge period needed to make the SRAM return from the standby mode to the normal mode (i.e., the dummy cycle period shown in FIG. 7) cannot have a fixed length.

In contrast, according to the second embodiment, the potential on the pairs of bit lines BL0, /BL0 and BL1, /BL1 is held at a constant level (i.e., ½ VDD level) in the standby mode. As a result, the precharge period needed to make the SRAM return from the standby mode to the normal mode (i.e., the dummy cycle period shown in FIG. 7) can have a fixed length.

In this embodiment, the potential on the bit lines is fixed at the ½ VDD level. Alternatively, any other constant level may be adopted so long as the level is lower than the VDD level. But the level is preferably equal to or lower than the ½ VDD level, i.e., the intermediate voltage level.

EMBODIMENT 3

Figure 12:
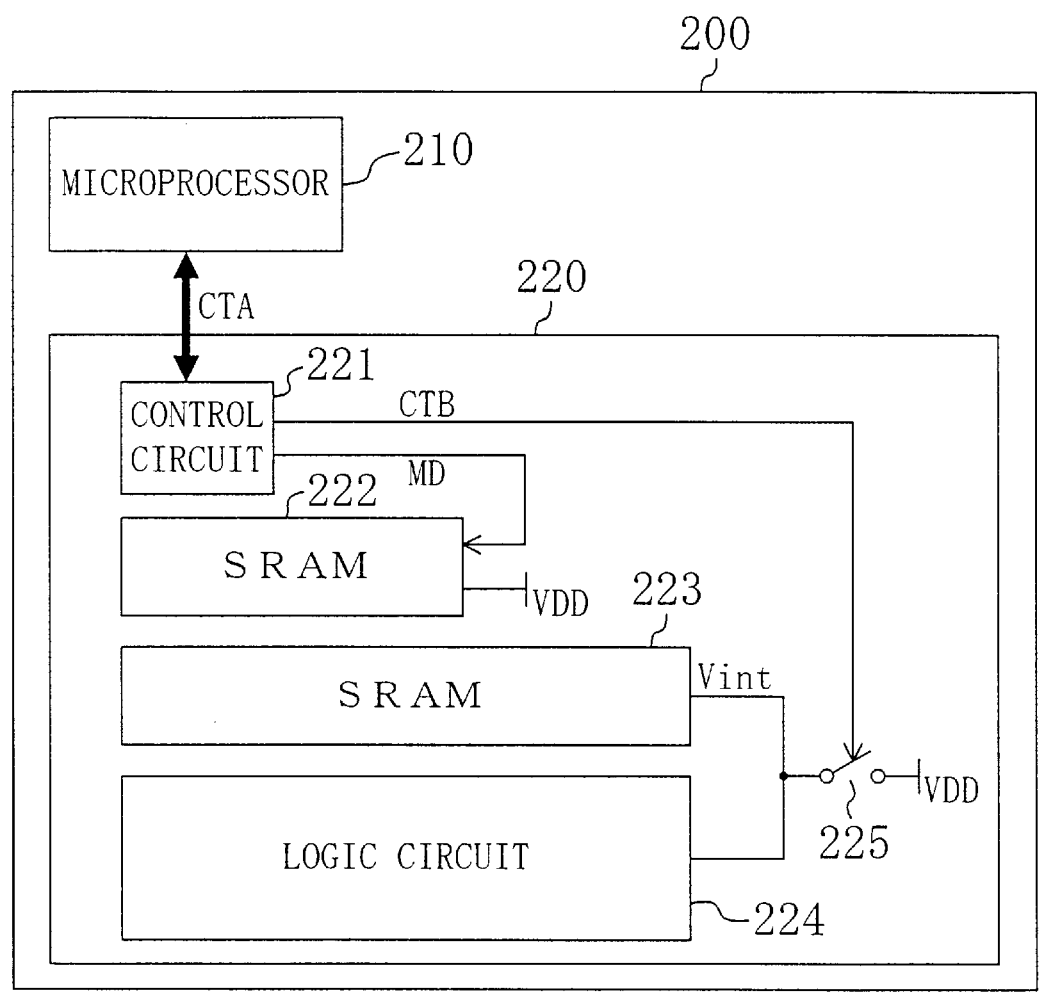
FIG. 12 is a block diagram illustrating a configuration for a mobile electronic unit according to a third embodiment of the present invention.

FIG. 12 illustrates a configuration for a mobile electronic unit 200 according to a third embodiment of the present invention. As shown in FIG. 12, the unit 200 includes a microprocessor 210 and a system LSI 220. Examples of mobile electronic units like this include cell phones.

The microprocessor 210 is always ON to function as a system controller for the electronic unit 200. Also, the microprocessor 210 supplies a mode switching signal CTA to the system LSI 220 to instruct the LSI 220 to switch the mode of operation from the normal mode into the standby mode, or vice versa.

The system LSI 220 includes control circuit 221, SRAMs 222 and 223, logic circuit 224 and switch 225.

Responsive to the mode switching signal CTA supplied from the microprocessor 210, the control circuit 221 supplies the mode signal MD to the SRAM 222 and a switching signal CTB to the switch 225, respectively. The SRAM 222 has the same configuration as the counterpart shown in FIG. 1 and can also reduce the amount of current dissipated in the standby mode. The supply voltage VDD is always supplied to the SRAM 222 even while the SRAM 222 is in the standby mode. On the other hand, to block the leakage current from flowing in the standby mode, the SRAM 223 is supplied with no power while in the standby mode. The switch 225 is connected between a power supply node receiving the supply voltage VDD and a power supply node for the SRAM 223 and logic circuit 224, and turns ON or OFF responsive to the switching signal CTB. Specifically, while the switch 225 is ON, the supply voltage VDD is supplied to the SRAM 223 and logic circuit 224. On the other hand, while the switch 225 is OFF, the supply voltage VDD is not supplied thereto.

That is to say, in this system LSI 220, power is always supplied to only the control circuit 221 and SRAM 222 that communicate with the microprocessor 210.

Hereinafter, it will be described how the mobile electronic unit with such a configuration operates.

When the system should change its mode of operation from normal mode into standby mode (e.g., when a cell phone enters a standby state), the microprocessor 210 supplies the mode switching signal CTA to the system LSI 220 to instruct the LSI 220 to change into the standby mode. That is to say, as shown in FIG. 13, the mode switching signal CTA falls from H-level to L-level at a time t11.

Synchronously with this fall of the mode switching signal CTA, the control circuit 221 negates the mode signal MD and switching signal CTB to L-level. Then, responsive to the L-level switching signal CTB, the switch 225 turns OFF. As a result, the power that has been supplied to the SRAM 223 and logic circuit 224 is interrupted. On the other hand, the SRAM 222 aborts the precharge operation in response to the L-level mode signal MD (see FIG. 7).

Figure 13:
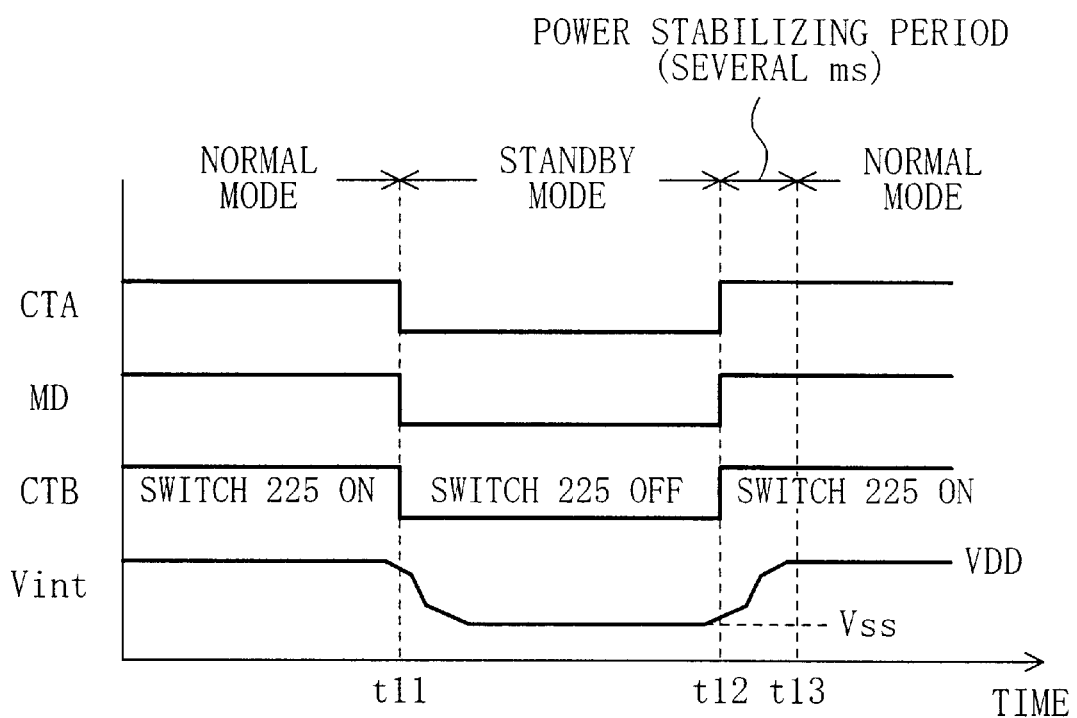
FIG. 13 is a timing diagram illustrating how the mobile electronic unit shown in FIG. 12 operates.

When the system returns from the standby mode to the normal mode, the mode switching signal CTA rises to H-level at a time t12 as shown in FIG. 13. In response, the switching signal CTB rises to H-level to turn the switch 225 ON. The mode signal MD also rises to H-level, thereby allowing the SRAM 222 to start its precharge operation. During the standby mode, the bit lines of the SRAM 222 are electrically disconnected from the power supply nodes, and have their potential levels dropped. Accordingly, it is expected that if all the bit lines were precharged at a time at the beginning of the precharge operation, a large peak current would flow. For that reason, precharging of the bit lines should preferably be started stepwise at some intervals. For example, multiple bit lines may be classified into several groups and the precharge operation on one of those groups may be started some time after the precharge operation on another has been started. It would take several milliseconds (i.e., the interval between times t12 and t13 shown in FIG. 13) for the voltage Vint to be stabilized at the VDD level after the switch 225 has turned ON. That is to say, it takes some time for the system LSI 220 to start operating stably enough. Accordingly, there is a sufficient amount of time for the SRAM 222 to return to the precharge state (i.e., the dummy cycles shown in FIG. 7 are available), and the precharge operation can be started step by step.

EMBODIMENT 4

Figure 14:
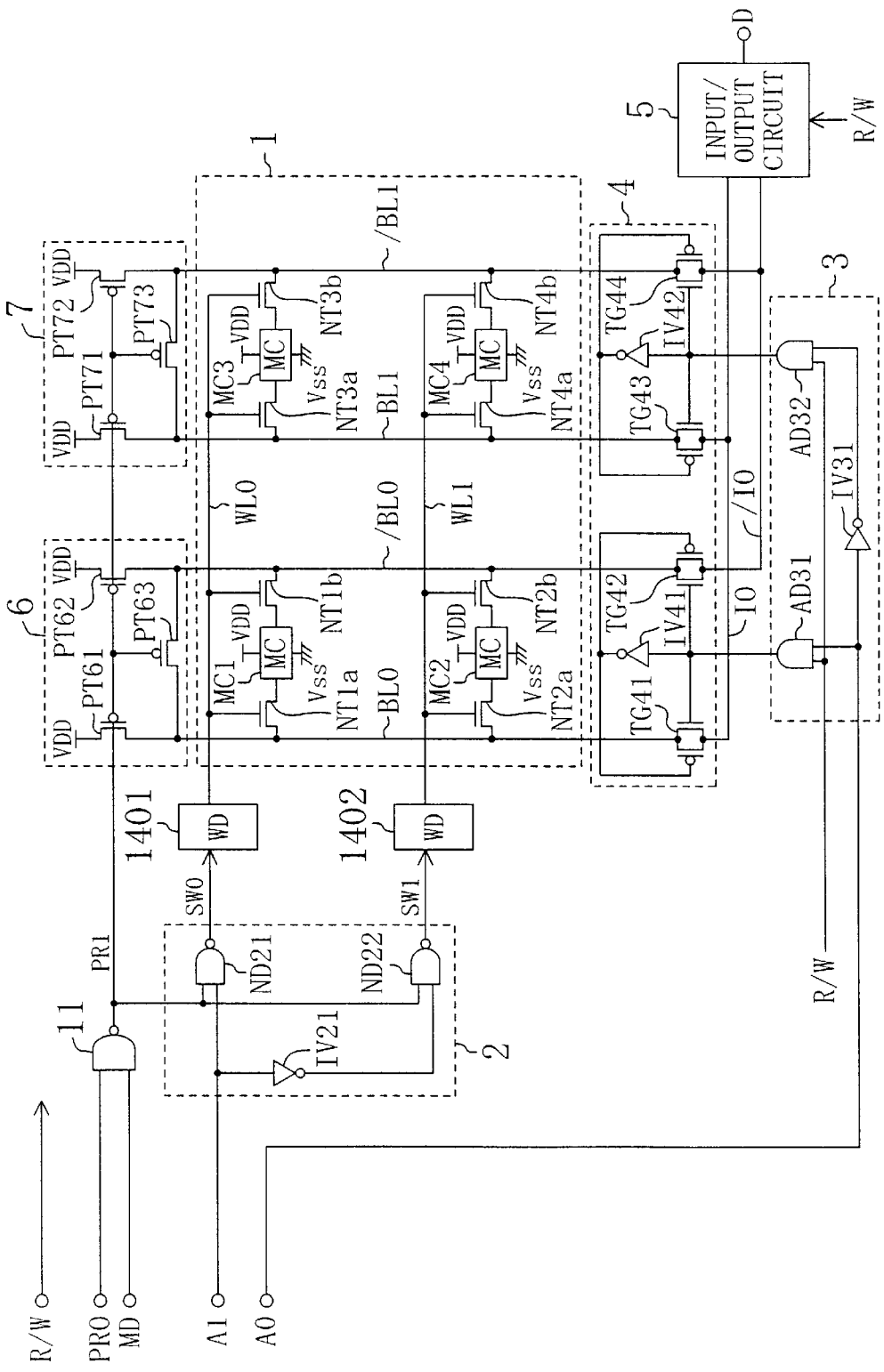
FIG. 14 is a circuit diagram illustrating an overall configuration for an SRAM according to a fourth embodiment of the present invention.

FIG. 14 illustrates an overall configuration for an SRAM according to a fourth embodiment of the present invention. As shown in FIG. 14, the SRAM includes memory array 1, row decoder 2, column decoder 3, column selector 4, input/output circuit 5, precharge circuits 6 and 7, word drivers 1401 and 1402 and NAND gate 11. Responsive to an H-level word line select signal SW0 or SW1, each of the word drivers 1401 and 1402 supplies the supply voltage VDD to its associated word line WL0 or WL1. And responsive to an L-level word line select signal SW0 or SW1, each of the word drivers 1401 and 1402 supplies the ground voltage Vss (=0 V) to its associated word line WL0 or WL1.

Next, it will be described how the SRAM shown in FIG. 14 can reduce the current dissipated in the standby mode.

This effect will be described only on the memory cells MC1 and MC2 for the sake of simplicity.

Figure 15:
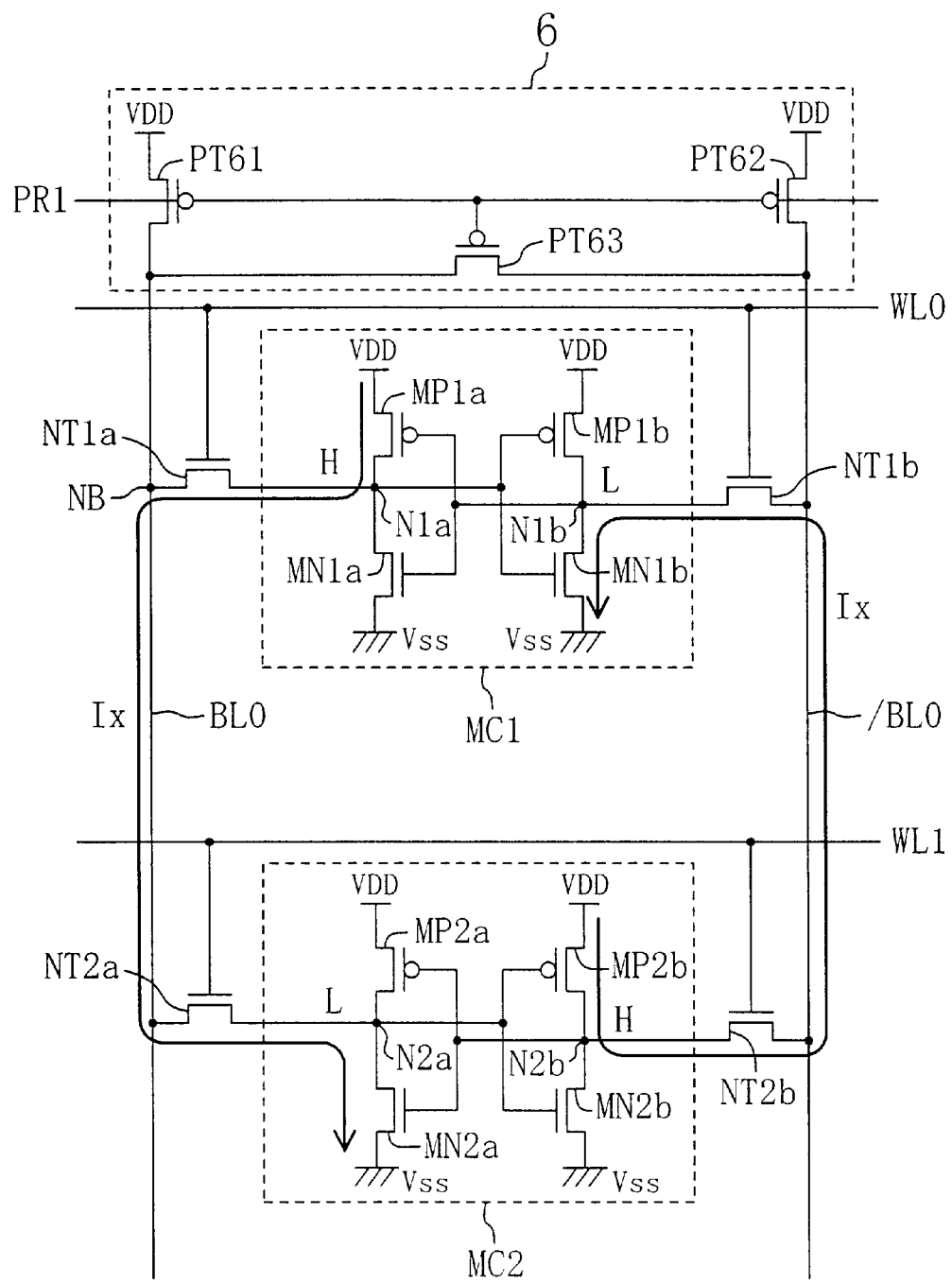
FIG. 15 is a circuit diagram illustrating where a leakage current flows in a standby mode.

In the standby mode, the ground voltage Vss (=0 V) is supplied onto the word lines WL0 and WL1 to turn the access transistors NT1a, NTb, NT2a and NT2b OFF. The transfer gates TG41 through TG44 and p-channel MOS transistors PT61 through PT63 and PT71 through PT73 also turn OFF to allow the bit lines BL0, /BL0 and BL1, /BL1 to be floating. However, as shown in FIG. 15, a leakage current Ix flows along a path running from a power supply node for the memory cell MC1 to a ground node for the memory cell MC2 by way of the p-channel MOS transistor MP1a, H-level data retention node N1a, access transistor NT1a, bit line BL0, access transistor NT2a, L-level data retention node N2a and n-channel MOS transistor MN2a. The leakage current Ix also flows along a path running from a power supply node for the memory cell MC2 to a ground node for the memory cell MC1 by way of the p-channel MOS transistor MP2b, H-level data retention node N2b, access transistor NT2b, bit line /BL0, access transistor NT1b, L-level data retention node N1b and n-channel MOS transistor MN1b. This is because the access transistors NT1a, NT1b, NT2a and NT2b have a low threshold voltage. The leakage current Ix holds the potential on the bit lines BL0 and /BL0 at a positive level, which is higher than the ground voltage Vss (=0 V) and lower than the supply voltage VDD. As a result, a negative potential difference is generated between the gate and source of the access transistors NT1a and NT2b. Accordingly, although the leakage current Ix flows through the access transistors NT1a and NT2b, the negative gate-source potential difference reduces the amount of the leakage current Ix flowing.

Figure 16:
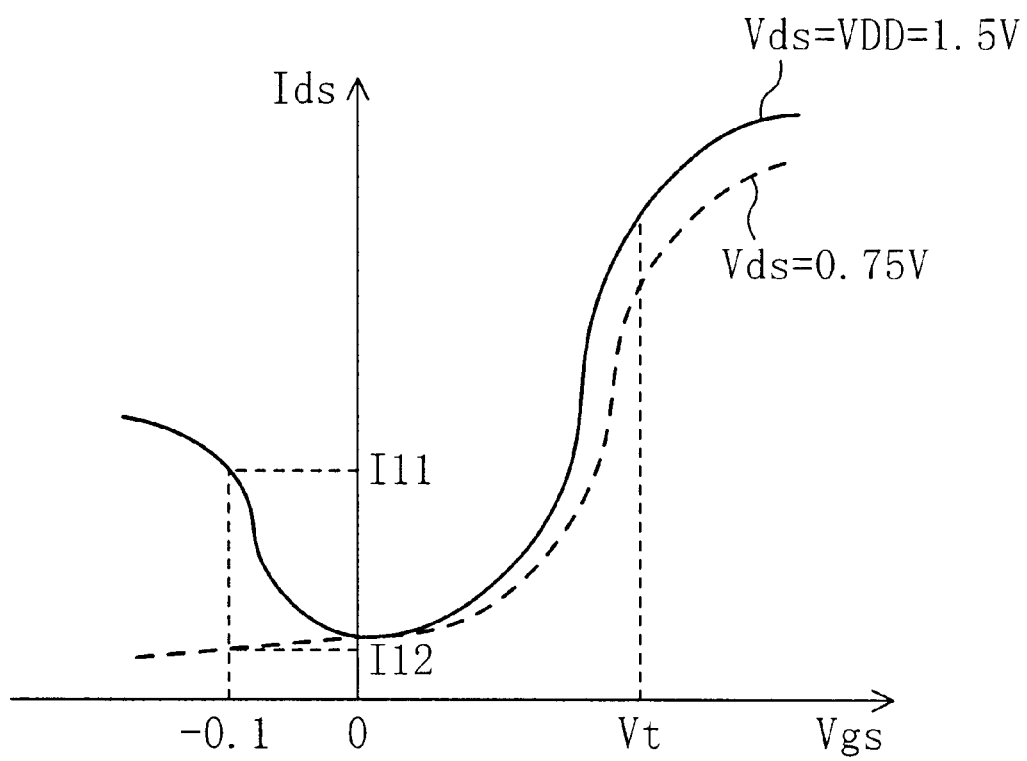
FIG. 16 is a graph illustrating a GIDL current.
Figure 17:
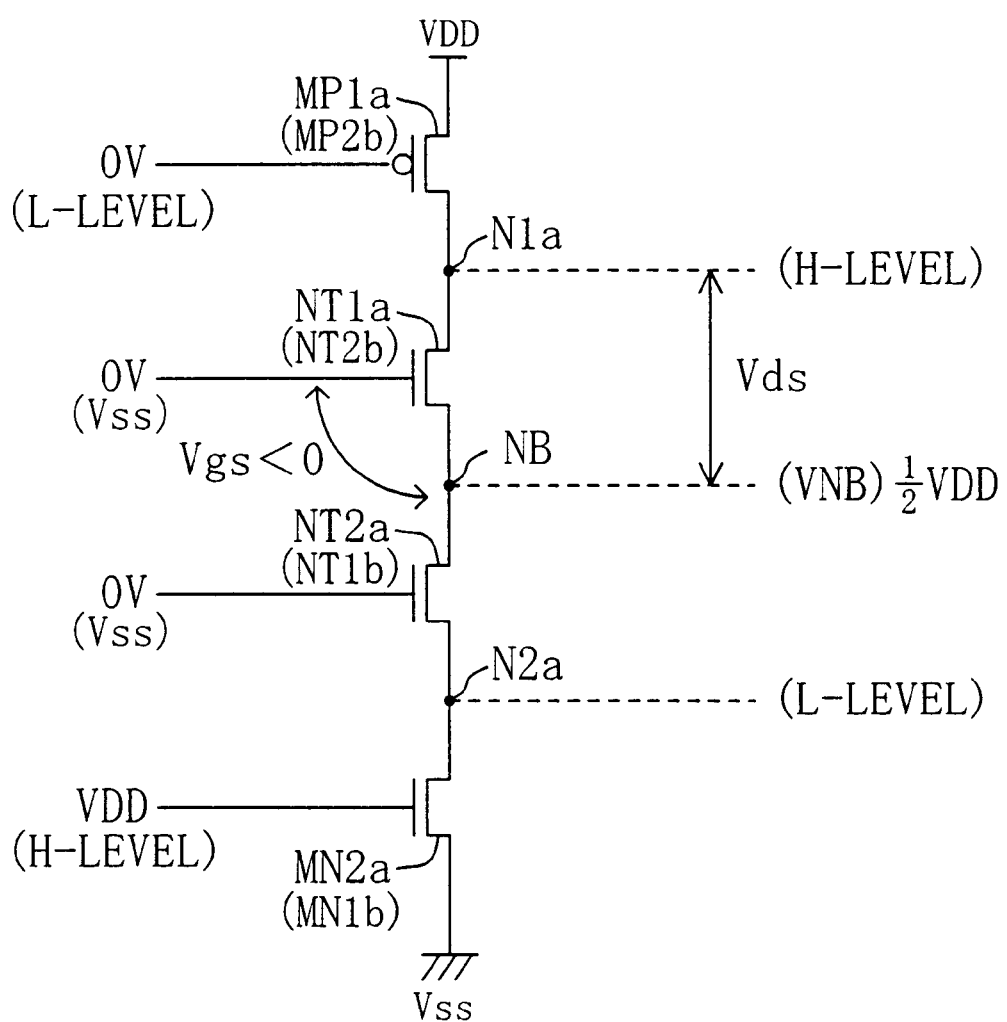
FIG. 17 illustrates how the amount of current dissipated can be reduced in a standby mode.

As described above, the leakage current Ix holds the potential on the bit lines BL0 and /BL0 at a positive level. However, the level is not necessarily constant, but may be close to the ground voltage Vss (=0 V). For example, the level may be 0.1 V. In that situation, each of the access transistors NT1a and NT2b has a negative gate-source voltage Vgs (i.e., −0.1 V) and a drain-source voltage Vds approximately equal to the supply voltage VDD (which is herein 1.5 V). Accordingly, a GIDL current (≈I11) is unintentionally allowed to flow as shown in FIG. 16. To avoid this GIDL current problem, the level holders 13 and 14 and ½ VDD generator 12 shown in FIG. 11 may be provided additionally. Then, as shown in FIG. 17, the potential level VNB on the bit lines BL0 and /BL0 during the standby mode gets equal to the ½ VDD level, and the drain-source voltage Vds of the access transistors NT1a and NT2b gets approximately equal to the ½ VDD level (i.e., 0.75 V). As a result, the GIDL current can be reduced to a negligible level I12 as shown in FIG. 16. Alternatively, instead of providing the level holders 13 and 14 and ½ VDD generator 12, the bit lines BL0 and /BL0 may be precharged to the ½ VDD level by the precharge circuits 6 and 7. Furthermore, the potential on the bit lines BL0 and /BL0 does not have to held at the ½ VDD level. Rather, the potential on the bit lines BL0 and /BL0 may be held at any level higher than the Vss (ground voltage) level (=0 V) and lower than the VDD (supply voltage) level so long as the GIDL current problem is avoidable.

What is claimed is:

1. A semiconductor memory device having a normal mode and a standby mode, the device comprising:

an array of memory cells arranged in columns and rows;

a plurality of word lines, each being associated with one of the rows;

a plurality of bit lines, each being associated with one of the columns;

a plurality of access transistors, each being provided for an associated one of the memory cells, connected between a data retention node of the associated memory cell and one of the bit lines that is associated with the memory cell, and receives, at its gate, a voltage on one of the word lines that is associated with the memory cell; and potential difference generating means for generating a negative potential difference between the gate and source of one of the access transistors while the device is in the standby mode, the access transistor being connected to a data retention node storing logical-one-level or logical-zero-level data thereon.

2. The device of claim 1, wherein if the potential difference between the gate and source of the access transistors is 0 V, a current of 100 pA/μm or more flows between the drain and source of the access transistor.

3. The device of claim 1, wherein the potential difference generating means comprises potential holding means for holding a potential on the bit lines at a predetermined positive level while the device is in the standby mode.

4. The device of claim 1, wherein the potential difference generating means comprises means for allowing the bit lines to be floating while the device is in the standby mode.

5. The device of claim 1, wherein the potential difference generating means comprises word line driving means for supplying a negative voltage onto the word lines while the device is in the standby mode.

6. A semiconductor memory device having a normal mode and a standby mode, the device comprising:

an array of memory cells arranged in columns and rows;

a plurality of word lines, each being associated with one of the rows;

a plurality of bit lines, each being associated with one of the columns;

a plurality of access transistors, each being provided for an associated one of the memory cells, connected between a data retention node of the associated memory cell and one of the bit lines that is associated with the memory cell, and receives, at its gate, a voltage on one of the word lines that is associated with the memory cell;

word line driving means for activating one of the word lines, the word line being associated with one of the memory cells that is to be accessed; and precharge means for precharging the bit lines to a supply voltage level during a predetermined period before the memory cell is accessed, wherein while the device is in the standby mode, the word line driving means supplies a negative voltage onto the word lines, and the precharge means electrically disconnects the bit lines from a power supply node receiving a supply voltage.

7. The device of claim 6, further comprising means for holding a potential on the bit lines at a predetermined level while the device is in the standby mode.

8. The device of claim 7, wherein the predetermined level is equal to or lower than an intermediate potential level.

9. The device of claim 6, wherein the word line driving means comprises:

means for supplying a ground voltage onto the word lines while the device is in the standby mode; and means for supplying the negative voltage onto the word lines after the ground voltage has been supplied thereto.

10. A semiconductor integrated circuit comprising a semiconductor memory device as recited in claim 6.

11. The circuit of claim 10, further comprising:

a logic circuit section; and supply switching means, which applies the supply voltage to the logic circuit section while the device is in the normal mode but does not apply the supply voltage to the logic circuit section while the device is in the standby mode, and wherein the precharge means of the semiconductor memory device precharges the bit lines to the supply voltage level when the device switches its mode of operation from the standby mode into the normal mode.

12. A mobile electronic unit comprising a semiconductor integrated circuit as recited in claim 10.

13. The unit of claim 12, further comprising means for supplying a mode switching signal to the semiconductor integrated circuit to instruct the circuit to switch the mode of operation from the normal mode into the standby mode, or vice versa.

* * * * *

UNITED STATES PATENT AND TRADEMARK OFFICE
CERTIFICATE OF CORRECTION

PATENT NO. : 6,333,874 B1
DATED : December 25, 2001
INVENTOR(S) : Hiroyuki Yamauchi It is certified that error appears in the above-identified patent and that said Letters Patent is hereby corrected as shown below:

<u>Title page,</u>
Item [30] Foreign Application Priority Data, change "12-094757" to
-- 2000-094757 --.

Signed and Sealed this

Sixteenth Day of April, 2002

Attest:

Attesting Officer

JAMES E. ROGAN
Director of the United States Patent and Trademark Office